United States Patent [19]

Runaldue

[11] Patent Number: 5,027,008
[45] Date of Patent: Jun. 25, 1991

[54] CMOS CLAMP CIRCUITS

[75] Inventor: Thomas J. Runaldue, San Jose, Calif.

[73] Assignee: Advanced Micro Devices, Inc., Sunnyvale, Calif.

[21] Appl. No.: 480,400

[22] Filed: Feb. 15, 1990

[51] Int. Cl.[5] ............... H03K 19/017; H03K 19/092; H03K 19/094; H03K 17/04

[52] U.S. Cl. ..................... 307/443; 307/548; 307/362; 307/272.3; 307/568; 307/475

[58] Field of Search ........... 307/592, 594, 597, 296.5, 307/268, 272.1, 272, 475, 451, 452, 453, 443, 546–550, 568, 304

[56] References Cited

U.S. PATENT DOCUMENTS

| | | | |
|---|---|---|---|
| 3,728,556 | 4/1973 | Arnell | 307/279 X |
| 4,140,930 | 2/1979 | Tanaka | 307/272.3 X |
| 4,216,390 | 8/1980 | Stewart | 307/279 X |
| 4,490,633 | 12/1984 | Noufer et al. | 307/548 |

Primary Examiner—Stanley D. Miller
Assistant Examiner—David R. Bertelson
Attorney, Agent, or Firm—Davis Chin

[57] ABSTRACT

A CMOS clamp circuit includes a sense inverter (I5) having an input node for receiving a sense current signal and an output node for generating a voltage output, an N-channel MOS clamping transistor (N5), and a P-channel MOS clamping transistor (P5). The N-channel clamping transistor (N5) has its drain connected to an upper power supply potential (VCC) and its source connected to the input node of the inverter (I5). The P-channel clamping transistor (P5) has its drain connected to a lower power supply potential (VSS) and its source connected to the input node of the sense inverter (I5). The gates of the N-channel and P-channel transistors (N5, P5) are connected to the output node of the sense inverter (I5). An enabling transistor and a power-down transistor may also be provided so as to operate the clamp circuit in a power-down mode of operation.

12 Claims, 2 Drawing Sheets

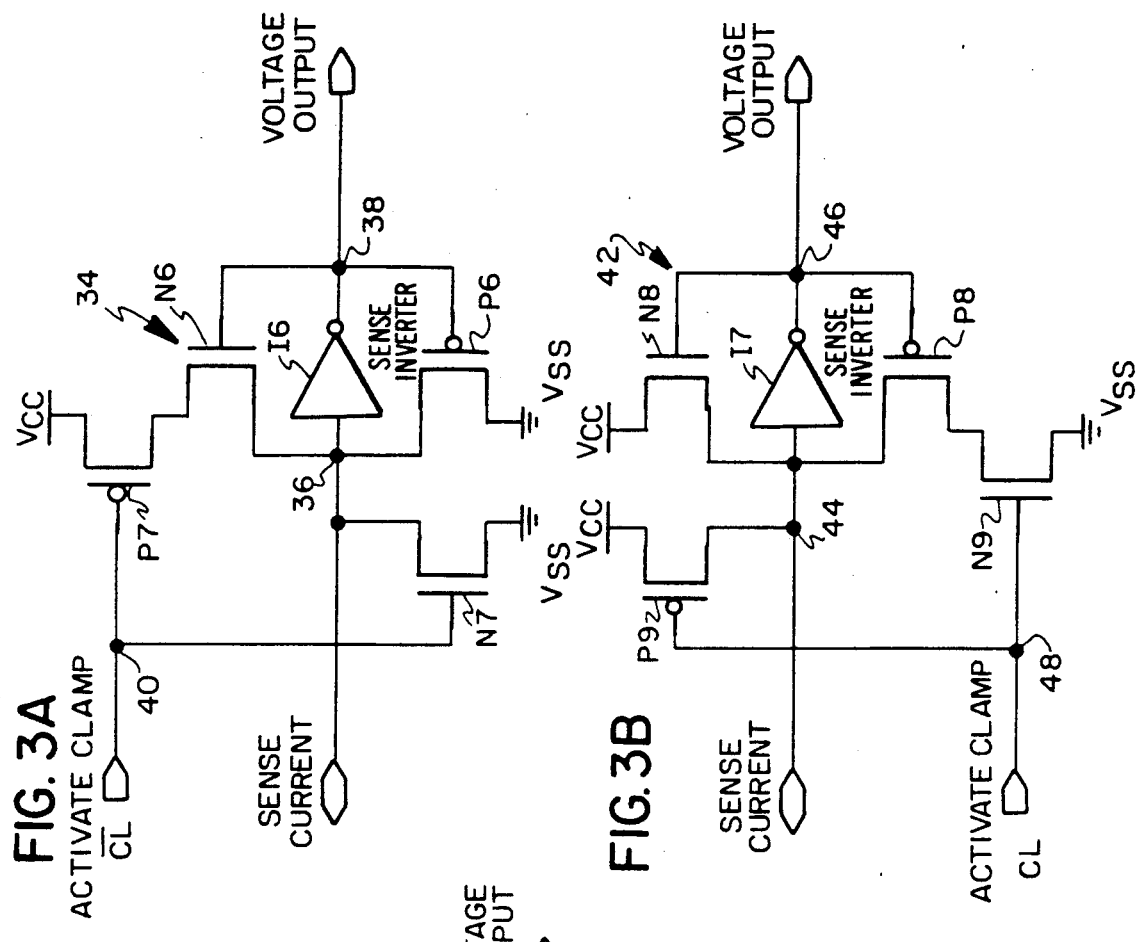

1

CMOS CLAMP CIRCUITS

DESCRIPTION

BACKGROUND OF THE INVENTION

This invention relates generally to CMOS semiconductor integrated circuits and more particularly, it relates to improved CMOS clamp circuits for limiting the voltage rise or drop on a particular node.

As is generally well known in CMOS digital integrated circuits normal logic levels are (1) a low or "0" logic state which is represented by a lower power supply potential VSS and (2) a high or "1" logic state which is represented by an upper power supply potential VCC. The lower power potential VSS is usually connected to an external ground or 0 volts and upper potential VCC is typically connected to a voltage source referenced above ground, i.e., +5.0 volts. It is often desirable to limit the voltage swings of CMOS circuits so as to improve their performance. By so limiting the voltage swing at a particular node, less charge will be required to be charged up and discharged at a particular node in a given circuit, thereby permitting a faster speed of operation.

While clamp circuits in CMOS technology are usually adequate to perform the function of limiting the voltage, they suffer from the disadvantage of consuming quiescent power. Thus, the problems of excessive power dissipation have limited the use of clamp circuits to critical areas of the design. Ideally, CMOS technology due to the complementary structure is generally considered to be a low power technology since standard logic circuits consume virtually no quiescent power and consumes power only during switching. However, this is true only if the voltage on the clamped node is at a true logic state of VSS or VCC. Typically, the clamp circuit by itself does not dissipate excess power but results in power consumption of circuits whose gate logic is connected to the clamp circuit. In practice, when the clamped node is not at one of the true logic states the logic gates connected thereto will not be completely turned off. If the actual logic voltages are above the ($VSS + V_{Tn}$) voltage level or below the ($VCC - V_{Tp}$) voltage level, then some amount of quiescent power will be dissipated. $V_{Tn}$ and $V_{Tp}$ are the respective body-effect enhanced thresholds of an N-channel transistor and a P-channel transistor.

All of the prior art clamp circuits in CMOS technology have generally resulted in an excessive amount of power being consumed when used to limit the voltage swings. Therefore, it would be desirable to provide improved CMOS clamp circuits which consume less power than has been traditionally available. Further, it would be expedient to provide CMOS clamp circuits which include a power down mode of operation in which the clamping transistor is deactivated, thereby reducing power consumption.

SUMMARY OF THE INVENTION

Accordingly, it is a general object of the present invention to provide improved CMOS clamp circuits which consume less power than has been traditionally available.

It is an object of the present invention to provide an improved CMOS clamp circuit which is formed of a sense inverter, an N-channel MOS clamping transistor, and a P-channel MOS clamping transistor.

It is another object of the present invention to provide an improved CMOS clamp circuit which includes a power-down mode of operation in which the clamping transistor is deactivated, thereby further reducing power consumption when the output of the sense inverter is not being used.

It is still another object of the present invention to provide an improved CMOS clamp circuit which includes a sense inverter, an N-channel MOS clamping transistor, a P-channel MOS clamping transistor, an enabling transistor, and a power-down transistor.

In one embodiment of the present invention, there is provided an improved CMOS clamp circuit which includes a sense inverter having an input node for receiving a sense current signal and an output node for generating a voltage output, an N-channel MOS clamping transistor, and a P-channel MOS clamping transistor. The N-channel transistor has its drain connected to an upper power supply potential and its source connected to the input node of the inverter. The P-channel transistor has its drain connected to a lower power supply potential and its source connected to the input node of the inverter. The gates of the N-channel and P-channel transistors are connected to the output node of the inverter.

In another embodiment of the present invention, there is provided an improved CMOS clamp circuit which further includes a P-channel MOS enabling transistor and an N-channel MOS pull-down transistor. In still another embodiment, there is provided an improved CMOS clamp circuit which further includes an N-channel MOS enabling transistor and a P-channel MOS pull-up transistor.

BRIEF DESCRIPTION OF THE DRAWINGS

These and other objects and advantages of the present invention will become more fully apparent from the following detailed description when read in conjunction with the accompanying drawings with like reference numerals indicating corresponding parts throughout, wherein:

FIG. 2 is a schematic circuit diagram of a CMOS clamping circuit, constructed in accordance with the principles of the present invention;

FIG. 3a is a schematic circuit diagram of a second embodiment of a CMOS clamping circuit having a powerdown mode, constructed in accordance with the principles of the present invention; and FIG. 3b is a schematic circuit diagram of a third embodiment of a CMOS clamping circuit having a power-down mode, constructed in accordance with the principles of the present invention.

DESCRIPTION OF THE PREFERRED EMBODIMENTS

Figure 1B:
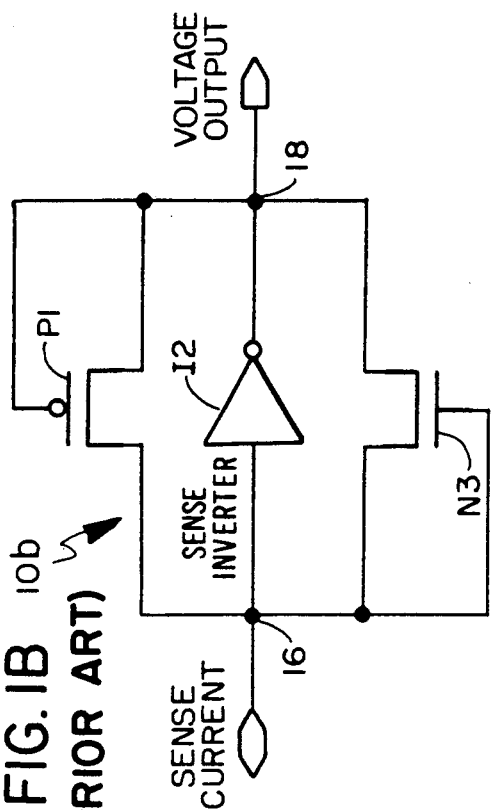
FIGS. 1a-1d illustrate various prior art clamping circuits which are constructed with a sense inverter and an N-channel and/or P-channel transistors.
Figure 1D:
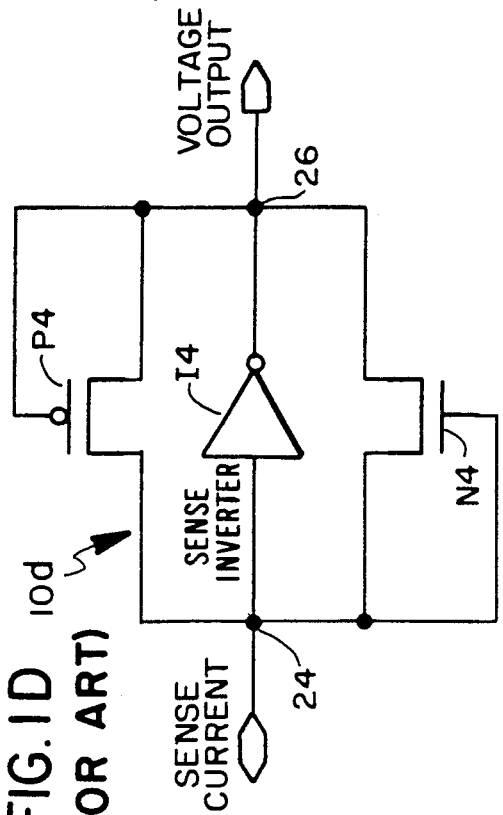
Figure 1A:
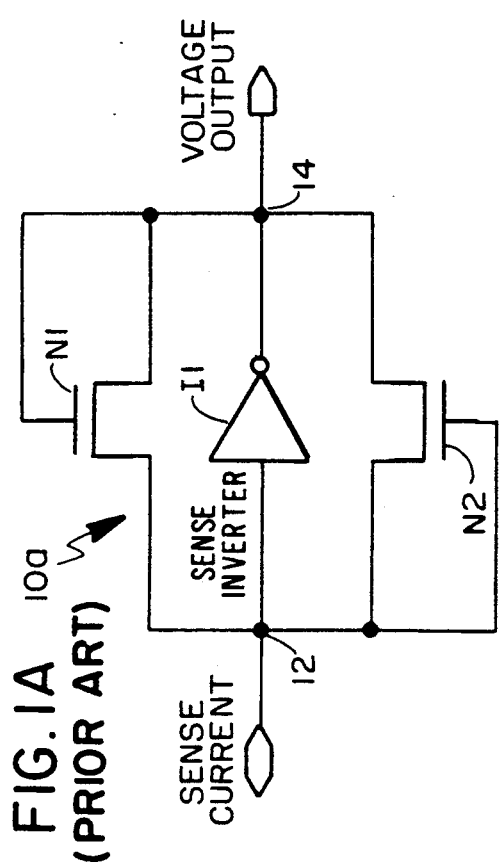

Referring now in detail to the drawings, there are shown in FIGS. 1a through 1d various prior art clamp circuits. In FIG. 1a, the clamp circuit 10a consists of a sense inverter I1 and a pair of N-channel MOS clamping transistors N1 and N2. The sense inverter I1 has its input connected to an input node 12 for receiving a sense current signal and has its output connected to an output node 14 for generating a voltage output. The gate and drain electrodes of the transistor N1 are connected together and to the output node 14. The source electrode of the transistor N1 is connected to the input node 12. The gate and drain electrodes of the transistor N2 are connected together and to the input node 12. The source electrode of the transistor N2 is connected to the output node 14.

In FIG. 1b, the clamp circuit 10b consists of a sense amplifier I2, a P-channel MOS clamping transistor P1, and an N-channel MOS clamping transistor N3. The sense inverter I2 has its input connected to an input node 16 for receiving a sense current signal and has its output connected to an output node 18 for generating a voltage output. The gate and source electrodes of the transistor P1 are joined together and to the input node 16. The drain electrode of the transistor P1 is connected to the output node 18. The gate and drain electrodes of the transistor N3 are connected together and to the input node 16. The source electrode of the transistor N3 is connected to the output node 18.

Figure 1C:
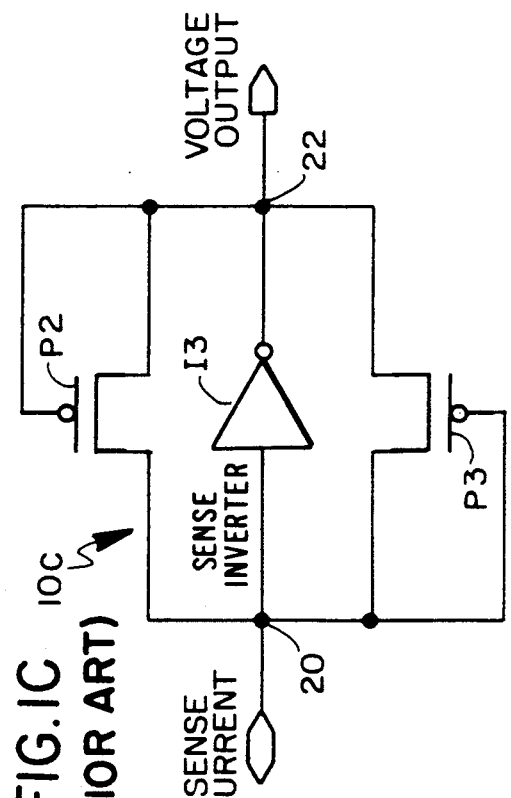

In FIG. 1c, the clamp circuit 10c is comprised of a sense inverter I3 and a pair of P-channel MOS clamping transistor P2 and P3. The sense inverter I3 has its input connected to an input node 20 for receiving a sense current signal and its output connected to an output node 22 for generating a voltage output. The gate and source electrodes of the transistor P2 are connected together and to the output node 22. The drain electrode of the transistor P2 is connected to the input node 20. The gate and source electrodes of the transistor P3 are connected together and to the input node 20. The drain electrode of the transistor P3 is connected to the output node 22.

In FIG. 1d, the clamp circuit 10d is comprised of a sense inverter I4, a P-channel MOS clamping transistor P4, and an N-channel MOS clamping transistor N4. The sense inverter I4 has its input connected to an input node 24 for receiving a current sense signal and its output connected to an output node 26 for generating a voltage output. The gate and source electrodes of the transistor P4 are connected together and to the output node 26. The drain electrode of the transistor P4 is connected to the input node 24. The gate and drain electrodes of the transistor N4 are connected together and to the output node 26. The source electrode of the transistor N4 is connected to the input node 24.

In the FIGS. 1a through 1d, each of the sense inverters I1-I4 is a conventional CMOS inverter formed of a P-channel transistor and an N-channel transistor whose gate electrodes are connected together defining an input of the inverter and whose drain electrodes are connected together defining an output of the inverter. The source electrode of the P-channel transistor is connected to a first power supply potential VCC, which is typically +5.0 volts. The source of the N-channel transistor is connected to a second power supply potential VSS, which is typically at 0 volts. It will be noted that if the actual logic levels at the respective input nodes 12, 16, 20 and 24 are above (VSS+$V_{Tn}$) or below (VCC−$V_{Tp}$) voltage levels, the corresponding clamping transistors will be actively turned on and thus some quiescent power will be burned in the respective sense inverters. Further, it should be clear that the inputs to the respective clamping transistors are from the output of the corresponding sense inverters. Therefore, the size of the transistors in the sense inverter must be made to be relatively large in order to supply current to the clamping transistors. Consequently, the clamp circuits 10a-10d in respective FIGS. 1a-1d suffer from excess power dissipation.

A CMOS clamp circuit 28 of the present invention is illustrated in FIG. 2 which is comprised of a sense inverter I5, an N-channel MOS clamping transistor, and a P-channel MOS clamping transistor P5. The sense inverter I5 has its input connected to an input node 30 for receiving a sense current signal and its output connected to an output node 32 for generating a voltage output. In contrast to the prior art clamping circuits 10a-10d, the inputs to the clamping transistors N5 and P5 are not connected to the output of the sense inverter I5 but are connected to the respective upper and lower power supply potentials VCC and VSS. In particular, the transistor N5 has its drain electrode connected to the upper power supply potential VCC, which is typically at +5.0 volts, and its source electrode connected to the input node 30. The transistor P5 has its drain connected to the lower power supply potential VSS, which is typically at 0 volts, and its source electrode connected to the input node 30. The output of the sense inverter I5 at the output node 32 is connected to the gates of the clamping transistors N5 and P5. Since the sense inverter I5 does not have to supply current to the clamping transistors N5 and P5, the sizes of the N-channel and P-channel transistors of the sense inverter I5 can be made smaller so as to reduce power consumption.

A second embodiment of a CMOS clamp circuit 34 of the present invention with a "power-down to logic zero state" mode of operation is depicted in FIG. 3a. The clamp circuit 34 is comprised of a sense inverter I6, an N-channel MOS clamping transistor N6, a P-channel MOS clamping transistor P6, a P-channel MOS enabling transistor P7, and an N-channel MOS pull-down transistor N7. The sense inverter I6 has its input connected to an input node 36 for receiving a sense current signal and its output connected to an output node 38 for generating a voltage output. The clamping transistor N6 has its gate connected to the output of the sense inverter I6 at the output node 38 and its source connected to the input of the sense inverter at the input node 36. The clamping transistor P6 has its gate connected to the output node 38, its source connected to the input node 36, and its drain connected to the lower power supply potential VSS.

The enabling transistor P7 has its source connected to the upper power supply potential VCC, its drain connected to the drain of the clamping transistor N6, and its gate connected to an input node 40 for receiving a complementary activate clamp signal $\overline{CL}$. The enable transistor P7 serves to isolate the clamping transistor N6 from the upper power supply potential so as to allow deactivation of the clamping transistor N6. The pull-down transistor N7 has its drain connected to the input node 36, its source connected to the lower supply potential VSS, and its gate connected also to the input node 40.

In operation, when the activate clamp signal $\overline{CL}$ is at an active low logic level the enable transistor P7 is rendered conductive and the clamping transistors N6 and P6 are allowed to function normally. It will be noted that in this case, the pull-down transistor N7 is turned off. When it is desired to operate in a power-down mode so as to reduce power consumption, the activate clamp signal $\overline{CL}$ is set to a high logic level which turns off the enabling transistor P7. Further, the pull-down transistor N7 is turned on which pulls down the input of the inverter I6 at the input node 36 to approximately the VSS voltage level. As a result, the sense inverter I6 will be powered down so as to have no current flow when the output node 38 is not being used.

A third embodiment of a CMOS clamp circuit 42 of the present invention with a "power-down to logic one state" mode of operation is depicted in FIG. 3b. The clamp circuit 42 is comprised of a sense inverter I7, an N-channel MOS clamping transistor N8, a P-channel MOS clamping transistor P8, an N-channel MOS enabling transistor N9, and a P-channel MOS pull-up transistor P9. The sense inverter I7 has its input connected to an input node 44 for receiving a sense current signal and its output connected to an output node 46 for generating a voltage output. The clamping transistor N8 has its gate connected to the output node 46, its drain connected to the upper power supply potential VCC, and its source connected to the input of the sense inverter I7 at the input node 44. The clamping transistor P8 has its gate connected to the output node 46 and its source connected to the input node 44.

The enabling transistor N9 has its drain connected to the drain of the clamping transistor P8, its source connected to the lower power supply potential VSS, and its gate connected to an input node 48 for receiving a true activate clamp signal CL. The enable transistor N9 serves to isolate the clamping transistor P8 from the lower power supply potential so as to allow deactivation of the clamping transistor P8. The pull-up transistor P9 has its drain connected to the input node 44, its source connected to the upper power supply potential VCC, and its gate connected also to the input node 48.

In operation, when the activate clamp signal CL is at a high logic level the enabling transistor N9 is rendered conductive and the clamping transistors N8 and P8 are allowed to function normally. It will again be noted that the pull-up transistor P9 is turned off. When it is desired to operate in a power-down mode so as to conserve power dissipation, the activate clamp signal CL is set to a low logic level which turns off the enabling transistor N9. Further, the pull-up transistor P9 is turned on which pulls the input of the inverter I7 at the input node 44 to approximately the VCC voltage level. Consequently, the sense inverter I7 will be powered down so as to have no current flow when the output node 46 is not being used.

From the foregoing detailed description, it can thus be seen that the present invention provides improved clamping circuits which consume less power than has been traditionally available. The CMOS clamping circuit of the present invention is comprised of a sense inverter, an N-channel MOS clamping transistor, and a P-channel MOS clamping transistor. Further, there may be provided an enabling transistor and a power-down transistor so as to power-down the sense inverter, thereby reducing power dissipation when its output is not being used.

While there has been illustrated and described what is at present considered to be preferred embodiments of the present invention, it will be understood by those skilled in the art that various changes and modifications may be made, and equivalents may be substituted for elements thereof without departing from the true scope of the invention. In addition, many modifications may be made to adapt a particular situation or material to the teachings of the invention without departing from the central scope thereof. Therefore, it is intended that this invention not be limited to the particular embodiments disclosed as the best modes contemplated for carrying out the invention, but that the invention will include all embodiments falling within the scope of the appended claims.

What is claimed is:

1. A CMOS clamping circuit comprising:
   sense inverter means (I6) having an input node for receiving a sense current signal and an output node for generating a voltage output;
   an N-channel MOS clamping transistor (N6) having its gate connected to the output node of said inverter means and it source connected to the input node of said inverter means;
   a P-channel MOS clamping transistor (P6) having its gate connected to the output of said inverter means, its source connected to the input node of said inverter means, and its drain connected to a lower power supply potential (VSS); and
   enabling means responsive to a complementary activate clamp signal for deactivating said N-channel clamping transistor (N6) so as to reduce power consumption when the output node of said inverter means is not being used.

2. A CMOS clamping circuit as claimed in claim 1, wherein said enabling means comprises a P-channel MOS enabling transistor (P7) having its source connected to an upper power supply potential (VCC) and its drain connected to the drain of said N-channel clamping transistor (N6), the gate of said enabling transistor (P7) being connected to a second input node for receiving the complementary activate clamp signal.

3. A CMOS clamp circuit as claimed in claim 2, further comprising power-down means responsive to the complementary activate clamp signal for pulling down the input node of said inverter means to the lower power supply potential (VSS) so as to have no current flow in said inverter means.

4. A CMOS clamp circuit as claimed in claim 3, wherein said power-down means comprises an N-channel MOS pull-down transistor (N7) having its drain connected to the input node of said inverter means, its source connected to the lower power supply potential (VSS), and its gate connected to the second input node for receiving the complementary activate clamp signal.

5. A CMOS clamp circuit as claimed in claim 4, wherein said inverter means comprises a CMOS inverter formed of a P-channel MOS transistor and an N-channel MOS transistor, the gates of said P-channel and N-channel transistors being connected together defining the input node, the drains of said P-channel and N-channel transistors being connected together defining the output node.

6. A CMOS clamp circuit as claimed in claim 5, wherein said enabling transistor (P7) is turned off and said pull-down transistor (N7) is turned on when said complementary activate clamp signal is at a high logic level.

7. A CMOS clamping circuit comprising:
   sense inverter means (I7) having an input node for receiving a sense current signal and an output node for generating a voltage output;
   a P-channel MOS clamping transistor (P8) having its gate connected to the output node of said inverter means and it source connected to the input node of said inverter means;
   an N-channel MOS clamping transistor (N8) having its gate connected to the output of said inverter means, its source connected to the input node of said inverter means, and its drain connected to an upper power supply potential (VCC); and enabling means responsive to a true activate clamp signal for deactivating said P-channel clamping transistor (P8) so as to reduce power consumption when the output node of said inverter means is not being used.

8. A CMOS clamping circuit as claimed in claim 7, wherein said enabling means comprises an N-channel MOS enabling transistor (N9) having its source connected to a lower power supply potential (VSS) and its drain connected to the drain of said P-channel clamping transistor (P8), the gate of said enabling transistor (N9) being connected to a second input node for receiving the true activate clamp signal.

9. A CMOS clamp circuit as claimed in claim 8, further comprising power-down means responsive to the true activate clamp signal for pulling up the input node of said inverter means to the upper power supply potential (VCC) so as to have no current flow in said inverter means.

10. A CMOS clamp circuit as claimed in claim 9, wherein said power-down means comprises a P-channel MOS pull-up transistor (P9) having its drain connected to the input node of said inverter means, its source connected to the upper power supply potential (VCC), and its gate connected to the second input node for receiving the true activate clamp signal.

11. A CMOS clamp circuit as claimed in claim 10, wherein said inverter means comprises a CMOS inverter formed of a P-channel MOS transistor and an N-channel MOS transistor, the gates of said P-channel and N-channel transistors being connected together defining the input node, the drains of said P-channel and N-channel transistors being connected together defining the output node.

12. A CMOS clamp circuit as claimed in claim 11, wherein said enabling transistor (N9) is turned off and said pull-up transistor (P9) is turned on when said true activate clamp signal is at a low logic level.

* * * * *